(12) United States Patent
Krames et al.

(10) Patent No.: US 8,445,929 B2
(45) Date of Patent: May 21, 2013

(54) WAVELENGTH-CONVERTED SEMICONDUCTOR LIGHT EMITTING DEVICE

(75) Inventors: Michael R. Krames, Mountain View, CA (US); Gerd O. Mueller, San Jose, CA (US)

(73) Assignee: Philips Lumileds Lighting Company LLC, San Jose, CA (US)

(*) Notice: Subject to any disclaimer, the term of this patent is extended or adjusted under 35 U.S.C. 154(b) by 0 days.

(21) Appl. No.: 12/723,720

(22) Filed: Mar. 15, 2010

(65) Prior Publication Data

US 2010/0200886 A1    Aug. 12, 2010

Related U.S. Application Data

(63) Continuation of application No. 12/021,627, filed on Jan. 29, 2008, now abandoned.

(51) Int. Cl.
  *H01L 33/00* (2010.01)
(52) U.S. Cl.
  USPC .............. 257/98; 257/E33.061; 257/E33.067; 438/22
(58) Field of Classification Search
  USPC .............................. 257/98, E33.061, E33.067
  See application file for complete search history.

(56) References Cited

U.S. PATENT DOCUMENTS

| | | |
|---|---|---|
| 3,103,607 A | 9/1963 | Rulon |
| 3,153,166 A | 10/1964 | Thornton, Jr. et al. |
| 5,376,580 A | 12/1994 | Kish et al. |
| 5,502,316 A | 3/1996 | Kish et al. |
| 5,661,316 A | 8/1997 | Kish, Jr. et al. |
| 5,676,891 A | 10/1997 | Boedinger |
| 5,779,924 A | 7/1998 | Krames et al. |
| 5,783,477 A | 7/1998 | Kish, Jr. et al. |
| 5,793,062 A | 8/1998 | Kish, Jr. et al. |
| 5,847,507 A | 12/1998 | Butterworth et al. |
| 5,959,316 A | 9/1999 | Lowery |
| 6,140,248 A | 10/2000 | Fischer et al. |
| 6,177,359 B1 | 1/2001 | Chen et al. |
| 6,274,924 B1 | 8/2001 | Carey et al. |
| 6,320,206 B1 | 11/2001 | Coman et al. |
| 6,351,069 B1 | 2/2002 | Lowery et al. |

(Continued)

FOREIGN PATENT DOCUMENTS

| | | |
|---|---|---|
| JP | 200031532 | 1/2000 |
| JP | 2001352104 | 12/2001 |

(Continued)

OTHER PUBLICATIONS

Nuclear Instruments &methods in Physica Research.*

(Continued)

*Primary Examiner* — Eugene Lee
*Assistant Examiner* — Elias M Ullah

(57) ABSTRACT

Embodiments of the invention include a light emitting structure comprising a light emitting layer. A first luminescent material comprising a phosphor is disposed in a path of light emitted by the light emitting layer. A second luminescent material comprising a semiconductor is also disposed in a path of light emitted by the light emitting layer. The second luminescent material is configured to absorb light emitted by the light emitting layer and emit light of a different wavelength. In some embodiments, one of the first and second luminescent materials may be bonded to the semiconductor structure.

16 Claims, 7 Drawing Sheets

U.S. PATENT DOCUMENTS

| | | |
|---|---|---|
| 6,373,188 B1 | 4/2002 | Johnson |
| 6,417,019 B1 | 7/2002 | Mueller et al. |
| 6,420,199 B1 | 7/2002 | Coman et al. |
| 6,486,499 B1 | 11/2002 | Krames et al. |
| 6,501,102 B2 | 12/2002 | Mueller-Mach et al. |
| 6,525,335 B1 | 2/2003 | Krames et al. |
| 6,526,082 B1 | 2/2003 | Corzine et al. |
| 6,569,704 B1 | 5/2003 | Takeuchi et al. |
| 6,570,190 B2 | 5/2003 | Krames et al. |
| 6,576,488 B2 | 6/2003 | Collins, III et al. |
| 6,603,258 B1 | 8/2003 | Mueller-Mach et al. |
| 6,630,691 B1 | 10/2003 | Mueller-Mach et al. |
| 6,642,618 B2 | 11/2003 | Yagi et al. |
| 6,642,652 B2 | 11/2003 | Collins, III et al. |
| 6,650,044 B1 | 11/2003 | Lowery |
| 6,680,569 B2 | 1/2004 | Mueller-Mach et al. |
| 6,682,207 B2 | 1/2004 | Weber et al. |
| 6,686,581 B2 | 2/2004 | Verhoeckx et al. |
| 6,686,691 B1 | 2/2004 | Mueller et al. |
| 6,696,703 B2 | 2/2004 | Mueller-Mach et al. |
| 6,717,353 B1 | 4/2004 | Mueller et al. |
| 6,800,500 B2 | 10/2004 | Coman et al. |
| 6,849,472 B2 | 2/2005 | Krames et al. |
| 6,853,663 B2 | 2/2005 | Hasnain et al. |
| 7,223,998 B2 * | 5/2007 | Schwach et al. ............... 257/86 |
| 7,510,890 B2 * | 3/2009 | Ott et al. ..................... 438/29 |
| 7,554,258 B2 | 6/2009 | Rossner |
| 2002/0030194 A1 * | 3/2002 | Camras et al. ................ 257/98 |
| 2003/0227249 A1 | 12/2003 | Mueller et al. |
| 2004/0072383 A1 | 4/2004 | Nagahama et al. |
| 2004/0173807 A1 * | 9/2004 | Tian et al. .................... 257/98 |
| 2005/0148110 A1 * | 7/2005 | Ott et al. ..................... 438/69 |
| 2005/0152146 A1 | 7/2005 | Owen et al. |
| 2005/0269528 A1 | 12/2005 | Kruit |
| 2006/0105478 A1 | 5/2006 | Camras et al. |
| 2006/0105484 A1 * | 5/2006 | Basin et al. .................... 438/27 |
| 2006/0202105 A1 | 9/2006 | Krames et al. |

FOREIGN PATENT DOCUMENTS

| | | |
|---|---|---|
| JP | 2002533938 | 10/2002 |
| JP | 2003025299 | 1/2003 |
| JP | 2003318447 | 11/2003 |
| JP | 2004146835 | 5/2004 |
| JP | 2004363343 | 12/2004 |
| KR | 1998702427 | 7/1998 |
| WO | 9950916 | 10/1999 |
| WO | 02061847 | 8/2002 |

OTHER PUBLICATIONS

Fabes et all, "Porosity and Composition Effects in Sol-Gel Derived Interference Fileters", Thin Solid Films 254 (1995) pp. 175-180.

Guo et al, "Photon Recycling Semiconductor Light Emitting Diode", IEEE, 1995, pp. 1-4.

Tavernier et al, "The Growth of N-Face GaN by MOCVD: Effect of Mg, Si, and In", Journal of Crystal Growth 264 (2004) pp. 150-158.

Weyher et al, "Morphological and Structural Characteristics of Homeopitaxial GaN Grown by Metalorganic Chemical Vapour Deposition", Journal of Crystal Growth 204 (1999) pp. 419-428.

Stutzmann et al, "Playing With Polarity", Phys. Stat. Sol. 9B) 228, No. 2 (2001) pp. 505-512.

Smart Cut™ Process, From WWW.SOITEC.COM.

* cited by examiner

WAVELENGTH-CONVERTED SEMICONDUCTOR LIGHT EMITTING DEVICE

CROSS-REFERENCE TO RELATED APPLICATIONS

This application is a continuation of U.S. application Ser. No. 12/021,627, filed Jan. 29, 2008, which is a division of U.S. application Ser. No. 11/080,801, filed Mar. 14, 2005, now U.S. Pat. No. 7,341,878. U.S. application Ser. No. 12/021,627, U.S. application Ser. No. 11/080,801, and U.S. Pat. No. 7,341,878 are incorporated herein by reference.

FIELD OF INVENTION

The present invention relates to wavelength converted semiconductor light emitting devices.

DESCRIPTION OF RELATED ART

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials, and binary, ternary, and quaternary alloys of gallium, aluminum, indium, and phosphorus, also referred to as III-phosphide materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip chip device).

FIG. 1 illustrates an example of a III-nitride flip chip device, described in more detail in U.S. Pat. No. 6,650,044. LED 2 includes a first semiconductor layer 10 of a first conductivity type and a second semiconductor layer 12 of a second conductivity type. Semiconductor layers 10 and 12 are electrically coupled to active region 14. Active region 14 is, for example, a p-n junction associated with the interface of layers 10 and 12. Alternatively, active region 14 includes one or more semiconductor layers that are doped n-type or p-type or are undoped. Optional transparent superstrate 16 is disposed on semiconductor layer 10. Contacts 18 and 20 are electrically coupled to semiconductor layers 10 and 12, respectively. Active region 14 emits light upon application of a suitable voltage across contacts 18 and 20. Interconnects 22 and 24 electrically couple contacts 18 and 20 to substrate contacts 26 and 28, respectively. In one implementation, semiconductor layers 10 and 12 and active region 14 are formed from III-nitride compounds such as $Al_xIn_yGa_z$, N compounds, and active region 14 emits blue light at a wavelength of, for example, about 470 nm. Optional transparent superstrate 16 is formed, for example, from sapphire or silicon carbide. Substrate 4 comprises silicon, for example. See U.S. Pat. No. 6,650,044, column 3 lines 40-63.

III-nitride LEDs structures are often grown on sapphire substrates due to sapphire's high temperature stability and relative ease of production. The use of a sapphire substrate may lead to poor extraction efficiency due to the large difference in index of refraction at the interface between the semiconductor layers and the substrate. When light is incident on an interface between two materials, the difference in index of refraction determines how much light is totally internally reflected at that interface, and how much light is transmitted through it. The larger the difference in index of refraction, the more light is reflected. The refractive index of sapphire (1.8) is low compared to the refractive index of the III-nitride device layers (2.4) grown on the sapphire. Thus, a large portion of the light generated in the III-nitride device layers is reflected when it reaches the interface between the semiconductor layers and a sapphire substrate. The totally internally reflected light must scatter and make many passes through the device before it is extracted. These many passes result in significant attenuation of the light due to optical losses at contacts, free carrier absorption, and interband absorption within any of the III-nitride device layers. The use of other growth substrates with an index of refraction that more closely matches that of the III-nitride material may reduce but generally will not completely eliminate the optical losses. Similarly, due to the large difference in index of refraction between III-nitride materials and air, elimination of the growth substrate also will not eliminate the optical losses.

SUMMARY

Embodiments of the invention include a light emitting structure comprising a light emitting layer. A first luminescent material comprising a phosphor is disposed in a path of light emitted by the light emitting layer. A second luminescent material comprising a semiconductor is also disposed in a path of light emitted by the light emitting layer. The second luminescent material is configured to absorb light emitted by the light emitting layer and emit light of a different wavelength. In some embodiments, one of the first and second luminescent materials may be bonded to the semiconductor structure.

DETAILED DESCRIPTION

Figure 1:
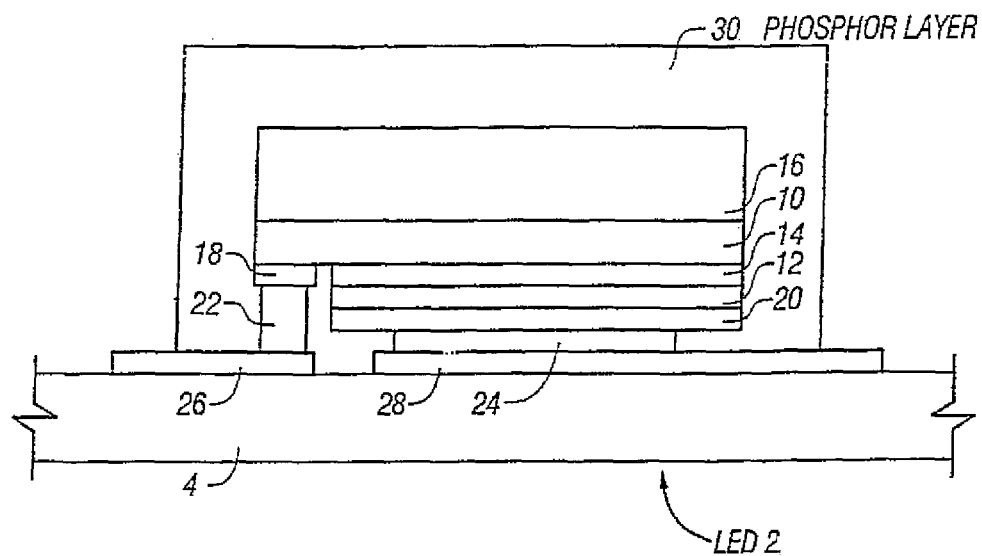
FIG. 1 illustrates a prior art flip chip III-nitride light emitting device.

The prior art device illustrated in FIG. 1 includes a layer 30 bearing a phosphor. Phosphors are luminescent materials that can absorb an excitation energy (usually radiation energy), then emit the absorbed energy as radiation of a different energy than the initial excitation energy. State-of-the-art phosphors have quantum efficiencies near 100%, meaning nearly all photons provided as excitation energy are reemitted by the phosphor. State-of-the-art phosphors are also highly absorbent. If a light emitting device can emit light directly into such a highly efficient, highly absorbent phosphor, the phosphor may efficiently extract light from the device, reducing the optical losses described above.

The device illustrated in FIG. 1 does not exploit these properties of phosphor. In the device illustrated in FIG. 1, substrate 16 separates phosphor layer 30 from the III-nitride device regions 10, 12, and 14. As described above, much light is trapped within the semiconductor layers due to the step in refractive index at the interface between the device layers and the substrate.

Figure 2:
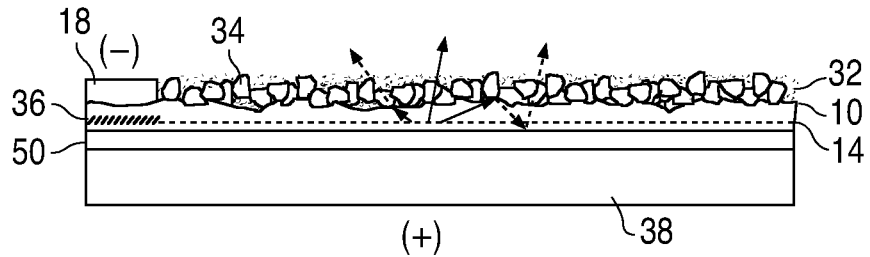
FIG. 2 illustrates a phosphor-converted III-nitride light emitting device according to an embodiment of the invention.

In accordance with embodiments of the invention, a phosphor is closely coupled to one of the semiconductor layers in a device to facilitate efficient extraction of light. FIG. 2 illustrates a first embodiment of the invention, where grains of phosphor are deposited on a III-nitride surface of a device exposed when the growth substrate is removed. Phosphor grains 34 are deposited on a surface of n-type region 10. The phosphor grains 34 are in direct contact with n-type region 10, such that light emitted from active region 14 is directly coupled to phosphor grains 34. An optical coupling medium 32 may be provided to hold phosphor grains 34 in place. Optical coupling medium 32 is selected to have a refractive index that is higher than the conventional binders described above, for example, higher than 1.5, and as close as possible without significantly exceeding the index of refraction of n-type region 10. For most efficient operation, no lossy media are included between n-type region 10, phosphor grains 34, and optical coupling medium 32. Phosphor grains 34 generally have a grain size between 0.1 and 20 microns, and more typically have a phosphor grain size between 1 and 8 microns.

Figure 3:
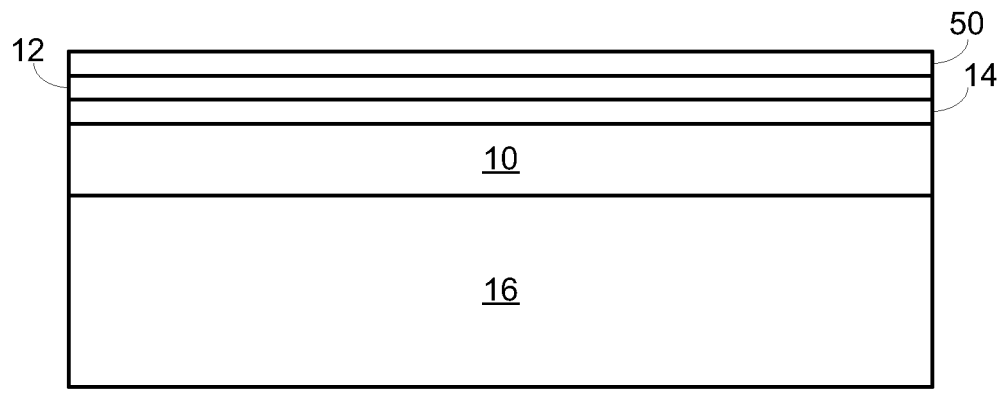
FIG. 3 illustrates epitaxial layers of a III-nitride light emitting device grown on a growth substrate.

The device illustrated in FIG. 2 may be formed by growing the device layers on a conventional growth substrate, bonding the device layers to a host substrate, then removing the growth substrate. FIG. 3 illustrates the device layers grown on a conventional growth substrate 16. N-type region 10 is grown over substrate 16. N-type region 10 may include optional preparation layers such as buffer layers or nucleation layers, and optional release layers designed to facilitate release of the growth substrate or thinning of the epitaxial layers after substrate removal. Active region 14 is grown over n-type region 10, followed by p-type region 12. One or more metal layers 50, including, for example, ohmic contact layers, reflective layers, barrier layers, and bonding layers, are deposited over p-type region 12.

Figure 4:
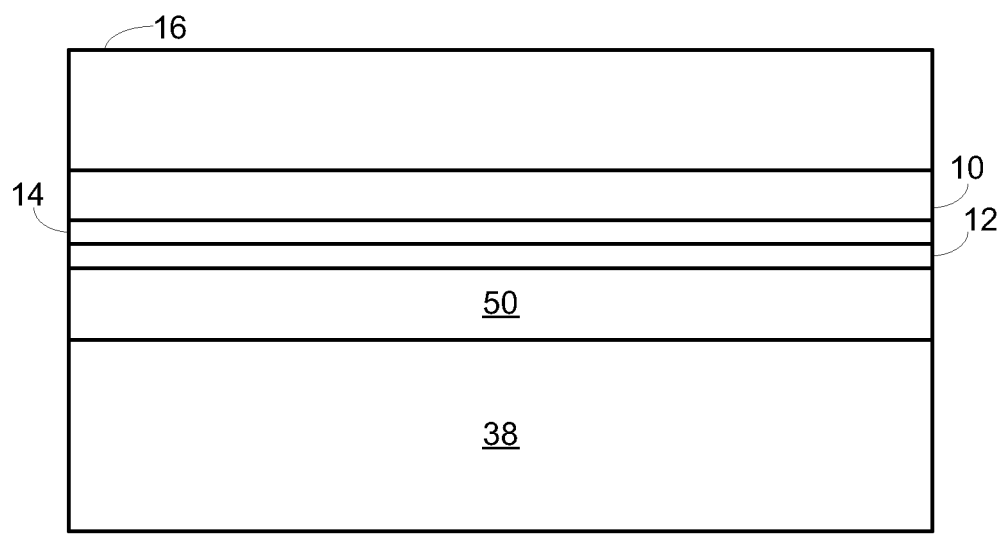
FIG. 4 illustrates the epitaxial layers of a III-nitride light emitting device bonded to a host substrate.

The device layers are then bonded to a host substrate 38, shown in FIG. 4, via the exposed surface of metal layers 50. One or more bonding layers (not shown), typically metal, may serve as compliant materials for thermo-compression or eutectic bonding between the epitaxial structure and the host substrate. Examples of suitable bonding layer metals include gold and silver. Host substrate 38 provides mechanical support to the epitaxial layers after the growth substrate is removed, and provides electrical contact to p-type region 12. Host substrate 38 is generally selected to be electrically conductive (i.e. less than about 0.1 Ωcm), to be thermally conductive, to have a coefficient of thermal expansion (CTE) matched to that of the epitaxial layers, and to be flat enough (i.e. with an root mean square roughness less than about 10 nm) to form a strong wafer bond. Suitable materials include, for example, metals such as Cu, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as MN, compressed diamond, or diamond layers grown by chemical vapor deposition.

The device layers may be bonded to host substrate 38 on a wafer scale, such that an entire wafer of devices are bonded to a wafer of hosts, then the individual devices are diced after bonding. Alternatively, a wafer of devices may be diced into individual devices, then each device bonded to host substrate 38 on a die scale.

Host substrate 38 and epitaxial layers 10, 12, and 14 are pressed together at elevated temperature and pressure to form a durable bond at the interface between host substrate 38 and metal layers 50, for example a durable metal bond formed between metal bonding layers (not shown) at the interface. The temperature and pressure ranges for bonding are limited on the lower end by the strength of the resulting bond, and on the higher end by the stability of the host substrate structure, metallization, and the epitaxial structure. For example, high temperatures and/or high pressures can cause decomposition of the epitaxial layers, delamination of metal contacts, failure of diffusion barriers, or outgassing of the component materials in the epitaxial layers. A suitable temperature range is, for example, about 200° C. to about 500° C. A suitable pressure range is, for example, about 100 psi to about 300 psi.

In order to remove a sapphire growth substrate, portions of the interface between substrate 16 and crystal region 10 are exposed, through substrate 16, to a high fluence pulsed ultraviolet laser in a step and repeat pattern. The exposed portions may be isolated by trenches etched through the crystal layers of the device, in order to isolate the shock wave caused by exposure to the laser. The photon energy of the laser is above the band gap of the crystal layer adjacent to the sapphire (GaN in some embodiments), thus the pulse energy is effectively converted to thermal energy within the first 100 nm of epitaxial material adjacent to the sapphire. At sufficiently high fluence (i.e. greater than about 1.5 J/cm$^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers from substrate 16. The resulting structure includes epitaxial layers 10, 12, and 14 bonded to host substrate 38. Any removal technique suitable to the particular growth substrate may be used. For example, in some embodiments, growth substrates such as Si, SiC, engineered substrates based on Si, and GaAs may be removed by other means, such as etching, lapping, or a combination thereof.

After the growth substrate is removed, the remaining epitaxial layers may be thinned, for example to remove portions of n-type region 10 closest to substrate 16 and of low material quality. The epitaxial layers may be thinned by, for example, chemical mechanical polishing, conventional dry etching, or photoelectrochemical etching (PEC). The top surface of the epitaxial layers may be textured or roughened to increase the amount of light extracted. A contact 18 is then formed on n-type region 10. Contact 10 may be, for example, a grid. The epitaxial layers beneath contact 18, region 36 on FIG. 2, may be implanted with, for example, hydrogen to prevent light emission from the portion of the active region 14 beneath contact 18.

Phosphor grains 34 are then deposited directly on the exposed surface of n-type region 10. Phosphor grains 34 may be applied by, for example, electrophoretic deposition, spin coating, spray coating, screen printing, or other printing techniques. In techniques such as spin coating or spray coating, the phosphor may be disposed in a slurry with an organic binder, which is then evaporated after deposit of the slurry by, for example, heating. Coupling medium 32 may then be applied. Phosphor particles may be nanoparticles themselves, i.e. particles ranging from 100 to 1000 nm in size. Spherical phosphor particles, typically produced by spray pyrolysis methods or other methods can be applied, yielding a layer with a high package density which provides advantageous scattering properties. Also, phosphors particles may be coated, for example with a material with a band gap larger than the light emitted by the phosphor, such as $SiO_2$, $Al_2O_3$, $MePO_4$ or -polyphosphate, or other suitable metal oxides.

Coupling medium 32 may be, for example $SiN_x$ or a high index glass, deposited by chemical vapor deposition. Examples of high index glasses include Schott glass SF59, Schott glass LaSF 3, Schott glass LaSF N18, and mixtures thereof. These glasses are available from Schott Glass Technologies Incorporated, of Duryea, Pa. Examples of other high index coupling media include high index chalcogenide glass, such as (Ge,Sb,Ga)(S,Se) chalcogenide glasses, III-V semiconductors including but not limited to GaN, II-VI semiconductors including but not limited to ZnS, ZnSe, ZnTe, ZnO, CdS, CdSe, and CdTe, organic semiconductors, metal oxides including but not limited to tungsten oxide, titanium oxide, nickel oxide, zirconium oxide, indium tin oxide, and chromium oxide, aluminum-based oxides such as alumina and spinel, metal fluorides including but not limited to magnesium fluoride and calcium fluoride, metals including but not limited to Zn, In, Mg, and Sn, phosphide compounds, arsenide compounds, antimonide compounds, nitride compounds, high index organic compounds, and mixtures or alloys thereof.

Other examples of suitable coupling media are high index nanoparticles incorporated into a binding medium then infused into phosphor layer 34. In such embodiments, nanoparticles having an index of refraction greater than that of the binding medium at wavelengths of light emitted by the light emitting region are dispersed in substantially transparent binding medium. The nanoparticles are selected to have diameters less than about a wavelength (e.g., a peak wavelength) of light emitted by the light emitting region and hence do not substantially scatter the emitted light. Preferably, the nanoparticles have diameters less than about ¼ of a peak emission wavelength of the light emitting region. For example, the nanoparticles may have diameters of about 2 nm to about 50 nm in a device where the light emitting region emits light having wavelengths greater than about 400 nm. The binding medium is substantially transparent, meaning that it transmits light at a peak wavelength emitted by the light emitting region with less than about 25%, preferably less than about 10%, more preferably less than about 2%, single pass loss due to absorption or scattering. The binding medium may be organic or inorganic and may comprise, for example, materials including but not limited to conventional epoxies, acrylic polymers, polycarbonates, silicone polymers, optical glasses, chalcogenide glasses, spiro compounds, and mixtures thereof. The nanoparticles do not substantially absorb light at wavelengths emitted by the light emitting region, particularly at peak emission wavelengths. The phrases "not substantially absorb" and "not substantially absorbing" are used herein to indicate that the nanoparticles in such implementations are sufficiently non-absorbing that they do not increase the single pass loss of light transmitted by the encapsulant to more than about 30%, preferably not to more than about 20%. One of ordinary skill in the art will understand that the loss due to absorption by the nanoparticles of light emitted by the light emitting region will depend on the absorption cross-sections of the individual nanoparticles, the concentration of the nanoparticles in the binding medium, and possibly on interactions between the nanoparticles and the surrounding material. Suitable nanoparticles for such implementations may include, but are not limited to, nanoparticles of metal oxides, nitrides, phosphates, nitridosilicates, and mixtures thereof. Suitable metal oxides may include, but are not limited to, calcium oxide, cerium oxide, hafnium oxide, titanium oxide, zinc oxide, zirconium oxide, and combinations thereof. Nanoparticles of such metal oxides having sizes ranging, for example, from about 2 nm to about 10 nm are available, for example, from Degussa-Huls AG of Frankfurt/Main Germany. Suitable nanoparticles for such implementations may also include nanoparticles of II-VI semiconductors such as zinc sulfide, zinc selenide, cadmium sulfide, cadmium selenide, cadmium telluride, and their ternary or quaternary mixtures, and nanoparticles of III-V semiconductors such as III-nitrides, III-phosphides, and mixtures thereof. Double or multi-shell nanoparticles may be used. The nanoparticles can be suspended in the binding medium or coated onto the phosphor in a previous process step, as described above.

A further example of a suitable coupling medium is a high index glass infused into phosphor grains 34 by a sol-gel process. Any organics are then removed by subsequent annealing. In embodiments where the coupling medium is a sol-gel glass, one or more materials such as oxides of titanium, cerium, lead, gallium, bismuth, cadmium, zinc, barium, or aluminum may be included in the $SiO_2$ sol-gel glass to increase the index of refraction of the glass in order to closely match the index of the glass with the indices of the phosphor and the III-nitride layer of the device. For example, a $Y_3Al_5O_{12}$:$Ce^{3+}$ phosphor may have an index of refraction of between about 1.75 and 1.8, and may be attached to a III-nitride layer with an index of refraction of about 2.4. In a preferred embodiment of such a device, the refractive index of the coupling medium is between the refractive indices of the $Y_3Al_5O_{12}$:$Ce^{3+}$ and the III-nitride layer. For example, Fabes et al., "Porosity and composition effects in sol-gel derived interference filters," Thin Solid Films 254 (1995) 175-180, which is incorporated herein by reference, recite a $SiO_2$—$TiO_2$—$Al_2O_3$ coating solution with a theoretical refractive index calculated to be n=1.85. Phosphor can be infused with such a solution to form a phosphor and coating solution slurry which is then deposited on the surface of the device, for example by spin coating, dried, then fired at a temperature appropriate to the coating solution.

Secondary optics known in the art such as dichroics or polarizers may be applied onto the emitting surface before or after phosphor grains 34, coupling medium 32, and contact 18, to provide further gains in brightness or conversion efficiency.

Figure 5:
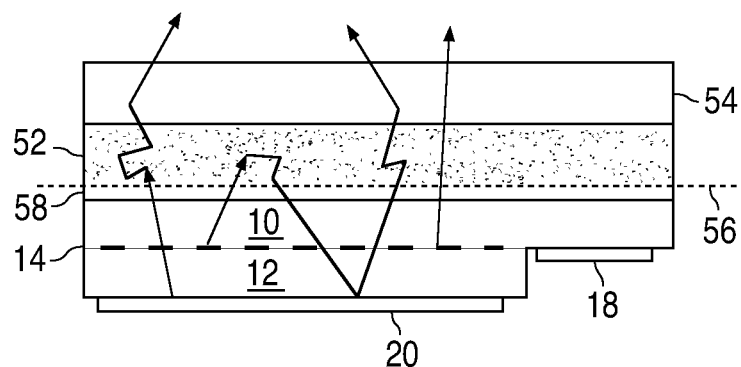
FIGS. 5 and 6 illustrate phosphor-converted III-nitride light emitting devices according to embodiments of the invention.
Figure 6:
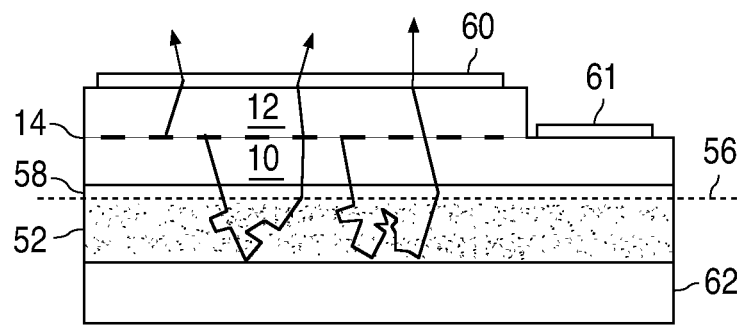

FIGS. 5 and 6 illustrate embodiments of the invention where the phosphor is a ceramic phosphor, rather than a phosphor powder. A ceramic phosphor may be formed by heating a powder phosphor at high pressure until the surface of the phosphor particles begin to soften and melt. The partially-melted particles stick together to form a rigid agglomerate of particles. Uniaxial or isostatic pressing steps, and vacuum sintering of the preformed "green body" may be necessary to form a polycrystalline ceramic layer. The translucency of the ceramic phosphor, i.e. the amount of scattering it produces, may be controlled from high opacity to high transparency by adjusting the heating or pressing conditions, the fabrication method, the phosphor particle precursor used, and the suitable crystal lattice of the phosphor material. Besides phosphor, other ceramic forming materials such as alumina may be included, for example to facilitate formation of the ceramic or to adjust the refractive index of the ceramic.

Unlike a thin film, which optically behaves as a single, large phosphor particle with no optical discontinuities, a ceramic phosphor behaves as tightly packed individual phosphor particles, such that there are small optical discontinuities at the interface between different phosphor particles. Thus, ceramic phosphors are optically almost homogenous and have the same refractive index as the phosphor material forming the ceramic phosphor. Unlike a conformal phosphor layer or a phosphor layer disposed in a transparent material such as a resin, a luminescent ceramic generally requires no binder material (such as an organic resin or epoxy) other than the phosphor itself, such that there is very little space or material of a different refractive index between the individual phosphor particles.

For example, a YAG:Ce ceramic may be formed as follows: 40 g $Y_2O_3$ (99.998%), 32 g $Al_2O_3$ (99.999%), and 3.44 g $CeO_2$ are milled with 1.5 kg high purity alumina balls (2 mm diameter) in isopropanol on a roller bench for 12 hrs. The dried precursor powder is then calcined at 1300° C. for two hours under CO atmosphere. The YAG powder obtained is then deagglomerated with a planet ball mill (agate balls) under ethanol. The ceramic slurry is then slip casted to obtain a ceramic green body after drying. The green bodies are then sintered between graphite plates at 1700° C. for two hours.

Examples of phosphors that may be formed into ceramic phosphors include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0\leq z\leq 0.1$, $0<a\leq 0.2$ and $0<b\leq 0.1$, such as $Lu_3Al_5O_{12}:Ce^{3+}$ and $Y_3Al_5O_{12}:Ce^{3+}$ which emit light in the yellow-green range; and $(Sr_{1-x}Ba_xCa_y)_{2-z}Si_{5-a}Al_aN_{8-a}O_a:Eu^{2+}$ wherein $0\leq a<5$, $0<x\leq 1$, $0\leq y\leq 1$, and $0<z\leq 1$ such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red emitting phosphors may also be suitable, including $(Sr_{i-a-b}Ca_bBa_c)Si_xN_yO_z:Eu^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0<x\leq 1$ including, for example, $CaS:Eu^{2+}$ and $SrS:Eu^{2+}$.

The ceramic phosphor is bonded to a nucleation structure 58 by a bond 56 at the interface between the nucleation structure 58 and the ceramic phosphor, either directly by wafer bonding or through an intermediate bonding layer (not shown in FIGS. 5 and 6). If a bonding layer is used, the bonding layer is selected to have an index of refraction between the indices of refraction of the III-nitride layer to which the bonding layer is applied and the ceramic phosphor. Many of the high index coupling materials described above may make suitable bonding layers.

In the embodiment illustrated in FIG. 5, p-contact 20 is reflective, or an additional reflector may be provided adjacent to contact 20, such that all light emission is directed toward the ceramic phosphor. An optional reflector 54, for example a distributed Bragg reflector, may be provided on the surface of the ceramic phosphor opposite the III-nitride device layers, to control the amount of emission from the active region that escapes the ceramic phosphor unconverted. For example, in devices where the active region emits UV light, reflector 54 may completely filter unconverted emission. In devices where the active region emits blue light, reflector 54 may attenuate the amount of unconverted blue light escaping the ceramic phosphor in order to achieve a desired emission spectrum. In some embodiments, reflector 54 may be omitted and the surface of ceramic phosphor 52 opposite the device layers may be roughened, textured, or shaped to improve light extraction. In addition, the translucency of the ceramic phosphor, i.e. the amount of scattering it produces, may be controlled from high opacity to high transparency, as described above.

Figure 13:
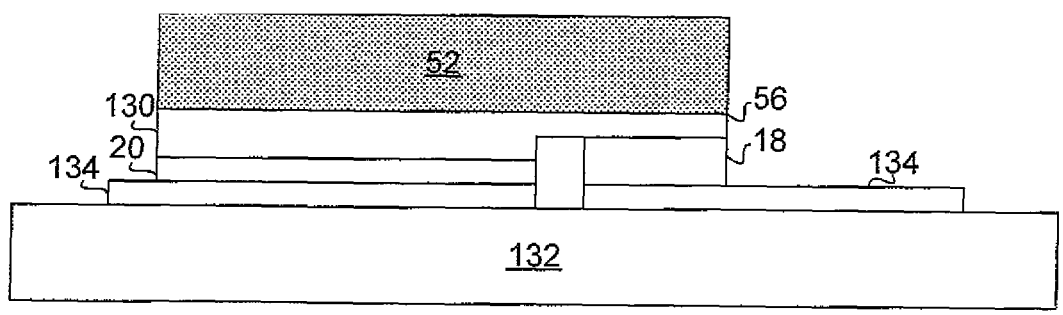
FIG. 13 illustrates the device of FIG. 5 bonded to a package element.

The embodiment illustrated in FIG. 5 may be bonded to a package element as illustrated in FIG. 13. Such a device is described in more detail in application Ser. No. 10/977,294, "Package-Integrated Thin Film LED," filed Oct. 28, 2004, and incorporated herein by reference. In the device illustrated in FIG. 13, semiconductor structure 130 including a light emitting region is bonded to ceramic phosphor 52 by bonded interface 56, as described below. Contacts 18 and 20 are formed on semiconductor structure 130, which are connected to package element 132 by metal interfaces 134. Package element 132 generally has a lateral extent exceeding that of semiconductor structure 130. In some embodiments, all of the layers disposed between package element 132 and ceramic phosphor 52 have a thickness less than 100 microns. Though FIG. 13 illustrates semiconductor structure 130 mounted on package element 132 in a flip chip configuration where both contacts 18 and 20 are formed on the same side of the semiconductor structure, in an alternative embodiment, a portion of ceramic phosphor 52 may be removed such that contact 18 is formed on the opposite side of semiconductor structure 130 as contact 20.

In the embodiment illustrated in FIG. 6, p-contact 60 and/or n-contact 61 are at least partially transparent and a reflector 62 is formed on or attached to the back of ceramic phosphor 52, such that all light emission is directed out of the device through contacts 60 and 61.

Figure 14:
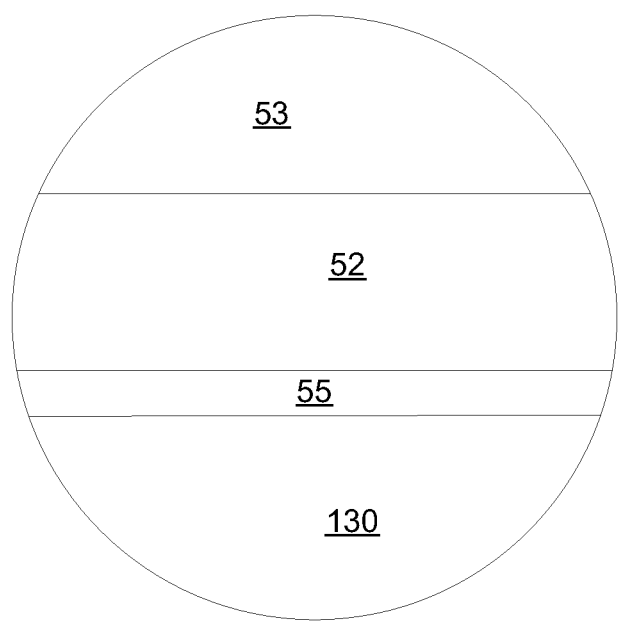
FIG. 14 illustrates a ceramic phosphor and an additional wavelength converting material bonded to a semiconductor structure with a bonding layer.

In some embodiments, the ceramic phosphor includes portions with inert particles rather than phosphor, or with phosphor crystals without activating dopant, such that those portions do not absorb and emit light. For example, $SiN_x$ may be included in ceramic phosphor 52 as inert particles. The activating dopant in the ceramic phosphor may also be graded, for example such that the phosphor in the portion of the ceramic closest to the device surface has the highest dopant concentration. As the distance from the device surface increases, the dopant concentration in the phosphor decreases. The dopant profile may take any shape including, for example, a linear, step-graded, or a power law profile, and may include multiple or no regions of constant dopant concentration. In some embodiments, the portion of the ceramic layer furthest from the device surface may not contain any phosphor or any dopant. The ceramic phosphor thickness and loading of activating dopant may be tailored to produce a desired emission spectrum. In some embodiments, the ceramic phosphor includes multiple phosphors, each emitting the same or different wavelengths of light. The multiple phosphors may be mixed and formed into a single homogenous ceramic phosphor, or the multiple phosphors may be formed in separate layers which make up a stack of phosphor layers within the ceramic phosphor. Similarly, multiple ceramic layers of the same phosphor material may be bonded together to form a multilayer ceramic stack. A device including a ceramic phosphor may also be used in conjunction with conventional phosphor layers, such conformal phosphor layers or phosphors disposed in epoxy. FIG. 14 illustrates a portion of the device of FIG. 13, including an additional wavelength converting material and a bonding layer. In the structure illustrated in FIG. 14, a ceramic phosphor 52 is bonded to a semiconductor structure 130 with a bonding layer 55, which is described, for example, in reference to FIG. 7. An additional wavelength converting material 53 is disposed on ceramic phosphor 52.

Figure 7:
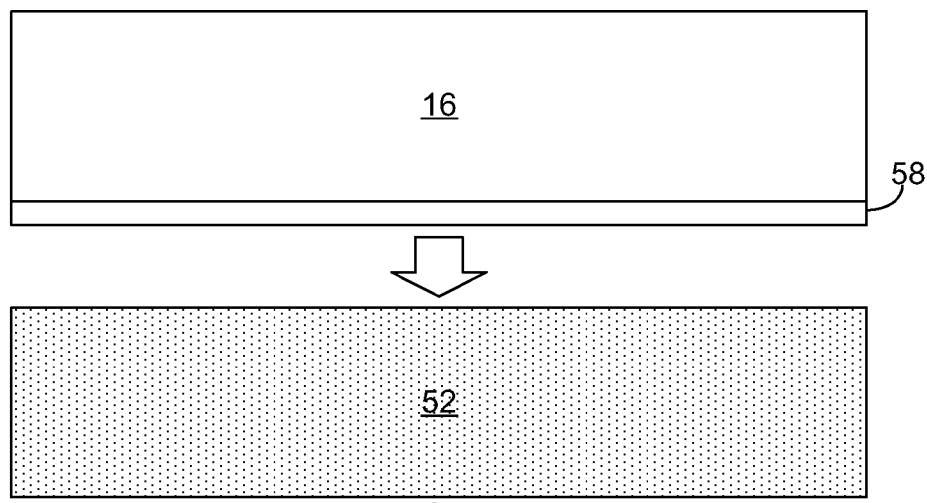
FIGS. 7, 8, and 9 illustrate a method of fabricating the devices illustrated in FIGS. 5 and 6.
Figure 8:
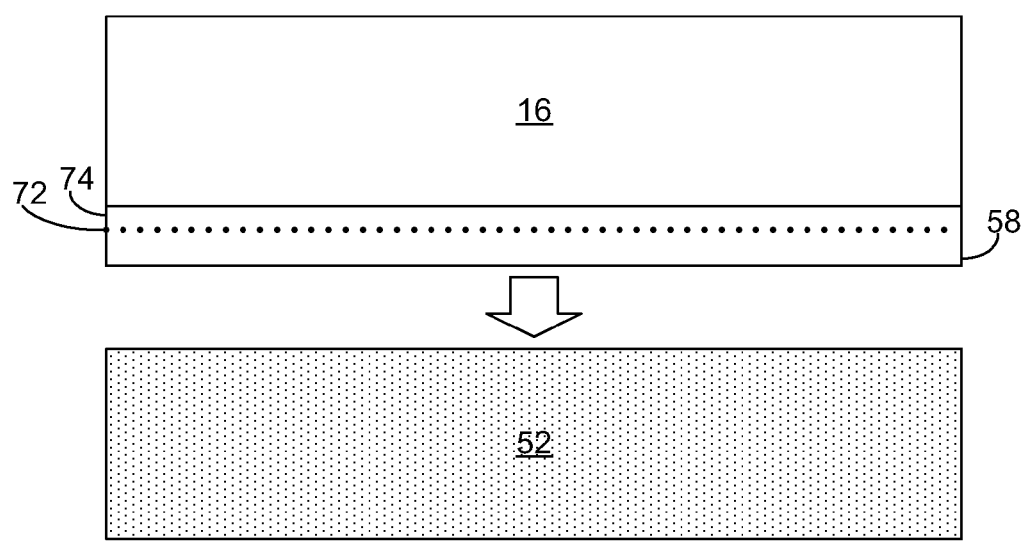
Figure 9:
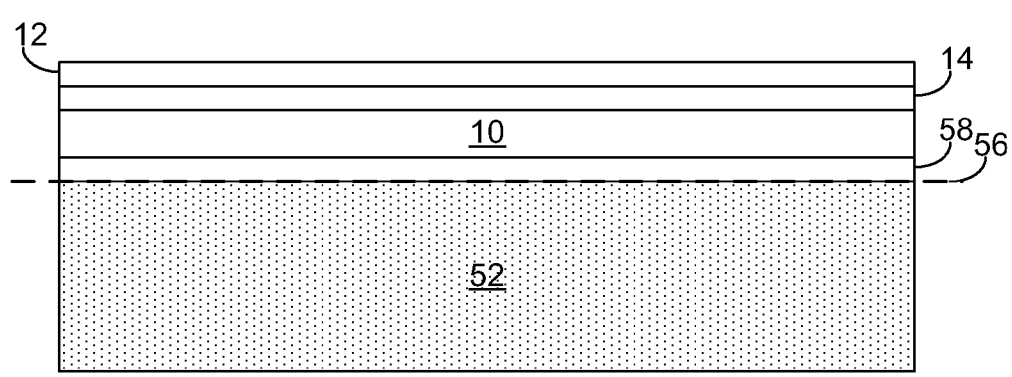

The device illustrated in FIG. 5 may be fabricated by using ceramic phosphor 52 as a growth substrate, as illustrated in FIGS. 7, 8, and 9. In FIG. 7, a single crystal nucleation layer 58 is grown over a growth substrate 16. In a preferred embodiment of FIG. 7, nucleation layer 58 is GaN and growth substrate 16 is sapphire. The surface of nucleation layer 58 and the surface of ceramic phosphor 52 are bonded together. An optional bonding layer may be disposed between the two bonded surfaces. The bonding layer is preferably highly transparent. In a preferred embodiment, the bonding layer has a high refractive index, for example between the refractive index of ceramic phosphor 52 and the refractive index of nucleation layer 58. An example of a suitable high index material is $TiO_2$. Transparent, low refractive index materials may be used as the bonding layer provided the bonding layer is thin. For example, $SiO_2$ may be used as a bonding layer at a thickness less than, for example, 100 Å. Absorbing materials may be used as a bonding layer provided the bonding layer is extremely thin. For example, Si may be used as a bonding layer at a thickness less than, for example, a several monolayers.

The surfaces are typically bonded under elevated temperature and pressure. An appropriate temperature for bonding may be, for example, between 500 and 1000° C.; an appropriate pressure for bonding may be, for example, between 5 and 1000 psi. The surfaces may be pressed together at the above temperature and pressure in an atmosphere of, for example, $N_2$ for a specified time period, for example, at least one hour. Under these conditions, a robust bond is formed between the two surfaces. Such a bond may withstand the temperatures necessary for further semiconductor processing subsequent to the bond, such as growing additional semiconductor layers. After bonding, growth substrate 16 may be removed by a method suitable to the substrate, such as laser melting for a sapphire substrate as described above, etching, or lapping.

Alternatively, as illustrated in FIG. 8, a single crystal nucleation layer 58 may be formed as part of a layer 74, which is formed over a growth substrate 16. In FIG. 8, nucleation layer 58 may be, for example, SiC, $Al_2O_3$, GaN or MN. Growth substrate 16 may be any suitable substrate. An implant species such as hydrogen is implanted in layer 74, as illustrated in FIG. 8 at 72. The surface of nucleation layer 58 and the surface of ceramic phosphor 52 are then bonded together as described above in reference to FIG. 7. After bonding, growth substrate 16 and the remaining layer 74 are removed by heating the structure until the implant species 72 dissociates, releasing the growth substrate from nucleation layer 58 and ceramic phosphor 52.

In both FIGS. 7 and 8, a bond is formed between ceramic phosphor 52 and nucleation layer 58 which can withstand growth of additional semiconductor layers. As illustrated in FIG. 9, the device layers, including n-type region 10, active region 14, and p-type region 12 are then grown over nucleation layer 58. In a finished device, to minimize the amount of light escaping from the sides of nucleation layer 58, it is desirable for nucleation layer 58 to be as thin as possible, for example thinner than 100 microns, preferably thinner than 10 microns, more preferably thinner than one micron. Prior to growing the III-nitride device layers, nucleation layer 58 may optionally be thinned.

In a preferred embodiment of FIG. 7, substrate 16 is sapphire and nucleation layer 58 is GaN or AlN. Wurtzite III-nitride layers have a gallium crystal face and a nitrogen crystal face. When GaN or AlN is conventionally grown on sapphire, the top surface of the crystal layer is typically the gallium face. Accordingly, when nucleation layer 58 is bonded to ceramic phosphor 52 and growth substrate 16 is removed, the exposed surface of nucleation layer 58 is the nitrogen face. The device layers, including n-type region 10, active region 14, and p-type region 12, may be grown with the same nitrogen-face orientation as nucleation layer 58, on the nitrogen face of nucleation layer 58. Nitrogen-face films may grown for example by molecular beam epitaxy or MOCVD, and is described in more detail in "Morpohological and structure characteristics of homoepitaxial GaN grown by metalorganic chemical vapour deposition (MOCVD)," Journal of Crystal Growth 204 (1999) 419-428 and "Playing with Polarity", Phys. Stat. Sol. (b) 228, No. 2, 505-512 (2001), both of which are incorporated herein by reference. Alternatively, a structure which reorients crystal growth to the gallium face, such as a low temperature semiconductor layer, may be grown before the device layers, such that the device layers are grown conventionally on the gallium face. In some embodiments, nucleation layer 58 may be grown with the nitrogen face on the surface, such that after bonding to ceramic phosphor 52 and removing growth substrate 16, the exposed surface is the gallium face. After the device layers are grown, the device may be processed by conventional means into either of the devices illustrated in FIGS. 5 and 6, for example by etching to expose portions of n-type region 10, then forming contacts on n-type region 10 and p-type region 12. The ceramic phosphor may include a carrier which may be removed or thinned by conventional processes such as etching or lapping, prior to dicing the wafer.

Figure 10:
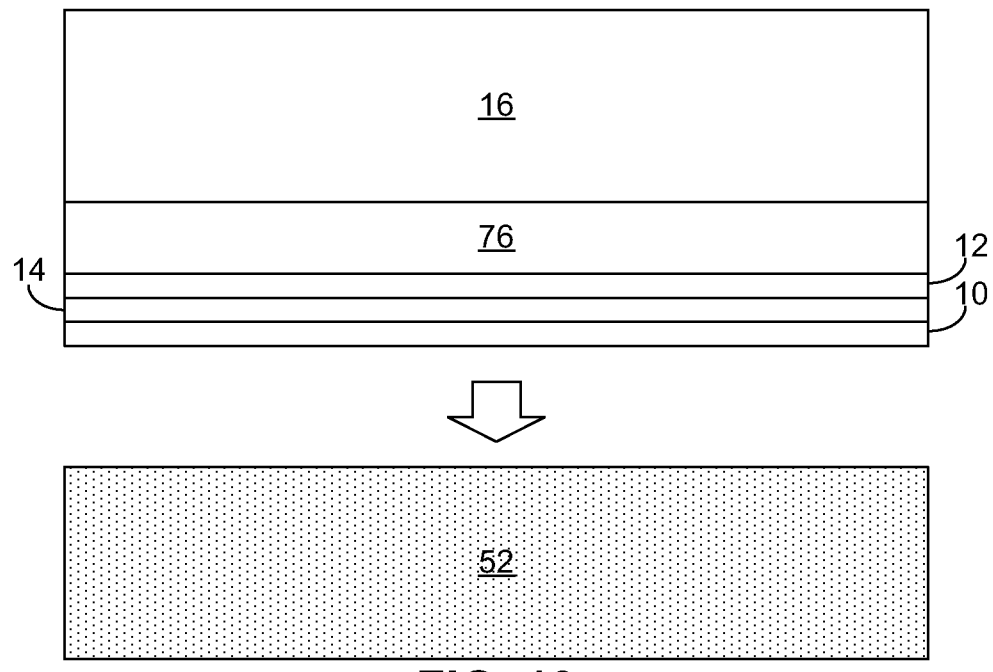
FIGS. 10 and 11 illustrate an alternative method of fabricating the devices illustrated in FIGS. 5 and 6.
Figure 11:
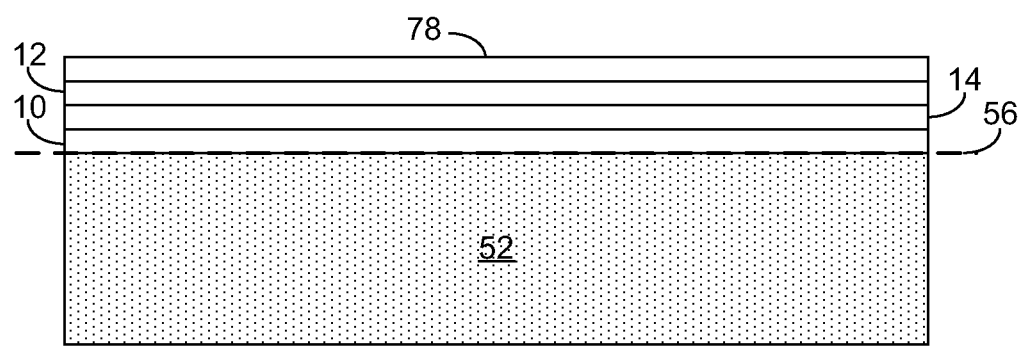

Alternatively, the devices illustrated in FIGS. 5 and 6 may be fabricated by growing the device layers on a growth substrate, then bonding the device layers to the ceramic phosphor as a host substrate, as illustrated in FIGS. 10 and 11. In such an embodiment, the p-type region is grown before the active region and the n-type region. Thus, an n-type or undoped region 76 is grown directly over a growth substrate 16. This region may include optional preparation layers such as buffer layers or nucleation layers, and optional release layers designed to facilitate release of the growth substrate or thinning of the epitaxial layers after substrate removal. P-type region 12 is then grown, followed by active region 14 and n-type region 10. The surface of n-type region 10 is then bonded to ceramic phosphor layer 52 through bond 56, as illustrated in FIG. 10 and described above in reference to FIG. 7. Though FIG. 10 shows bond 56 formed at the surface of n-type region 10, the surface of the semiconductor structure bonded to ceramic phosphor 52 may be p-type, n-type, or undoped. Bond 56 must be transparent. A bonding layer may be disposed between the two bonded surfaces to facilitate bonding, as described above. Once growth substrate 16 is removed as illustrated in FIG. 11, the epitaxial layers are etched to remove the region grown directly over the growth substrate, exposing p-type region 12. The surface of p-type region 12 may be treated, for example by regrowing p+ material 78 or by annealing under ammonia to increase the density of holes and to repair damage caused by etching, as described in more detail in "Polarization-Reversed III-Nitride Light Emitting Device," application Ser. No. 11/080,022, which is incorporated herein by reference. The wafer may then be processed by conventional means into either of the devices of FIGS. 5 and 6; however, such devices would not include nucleation layer 58, shown in FIGS. 5 and 6, rather bond 56 would be disposed between ceramic phosphor layer 52 and n-type region 10.

An advantage of ceramic phosphors, particularly in the device of FIG. 5 where light is extracted from the device through the ceramic phosphor, is the ability to mold, grind, machine, hot stamp or polish the ceramic layers into shapes that are desirable, for example, for increased light extraction. Luminescent ceramic layers generally have high refractive indices, for example 1.75 to 1.8 for a $Y_3Al_5O_{12}:Ce^{3+}$ ceramic phosphor. In order to avoid total internal reflection at the interface between the high index ceramic phosphor and air, the ceramic phosphor may be shaped into a lens such as a dome lens or a Fresnel lens. Light extraction from the device may be further improved by roughening or texturing the top of the ceramic phosphor, either randomly or in a repeating pattern. Also, the extent of the ceramic phosphor may be selected to provide uniform color relative to viewing angle. For example, in a device where one or more phosphors combine with unconverted blue light emitted by the light emitting region, if the ceramic phosphor is significantly smaller than the active region, when viewed from the top, the white light may appear to be surrounded by a blue ring. If the ceramic phosphor is significantly larger than the active region, the white light may appear to be surrounded by a yellow ring. In embodiments where the ceramic phosphor is shaped into a lens, favorable light extraction is expected for shaped ceramic phosphors having a bottom length at least twice the length of the face of device on which the ceramic phosphor is mounted. In such embodiments, the location of wavelength-converting phosphor within the ceramic body may be selected to provide uniform mixing of the light. For example, the wavelength converting material may be confined to the portion of the ceramic body closest to the top semiconductor layer of the device. In other embodiments, wavelength converting material may be provided in a first ceramic phosphor body, then attached to a second, shaped, transparent ceramic body.

Figure 12:
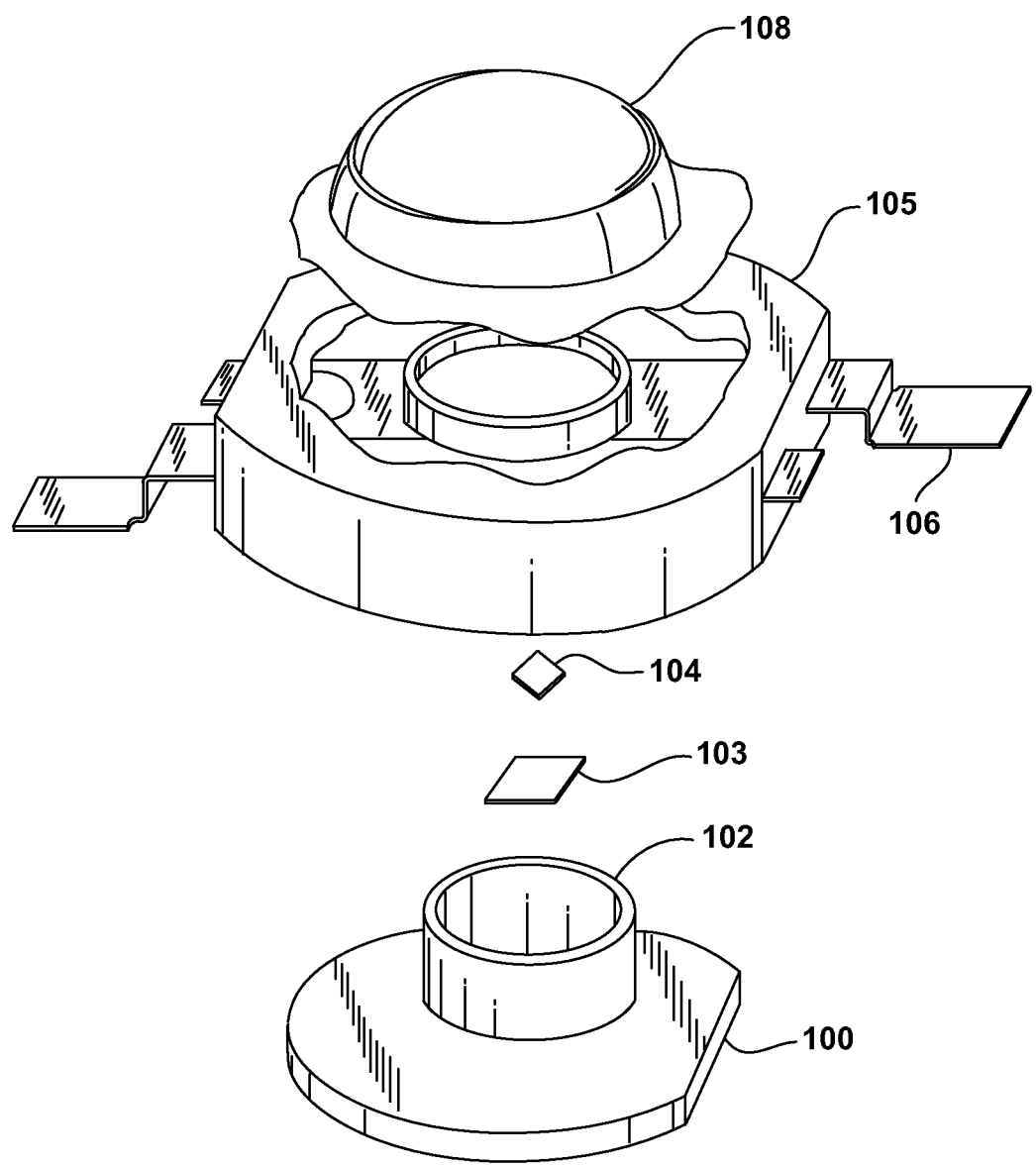
FIG. 12 is an exploded view of a packaged light emitting device.

FIG. 12 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Embodiments of the present invention may offer several advantages. First, light emitted from the active region has a high probability of being absorbed by the phosphor with very little loss. When the light is reemitted by the phosphor, it must escape the phosphor region, but the environment within the phosphor region is nearly optically lossless. The phosphor region provides many randomization events, necessary for light to escape the phosphor region into the ambient, through scattering and reabsorption and reemission by the phosphor. Accordingly, the embodiments described above may provide better light extraction than prior art devices. Second, some embodiments described above eliminate the organic binders used in the prior art device illustrated in FIG. 1, and thus eliminate problems caused by the degradation of those organic binders, for example during high temperature operation.

Any luminescent material with the above-described desirable properties of phosphors, such as high absorption of light emitted by the primary light emitting layer and high quantum efficiency, may be used to efficiently produce light in the above-described embodiments. Accordingly, the invention is not limited to phosphors. Wavelength-converting materials with a large imaginary component of refractive index, k, at wavelengths emitted by the light emitting region and negligible k at the converted wavelength, such as for example some III-V and II-VI semiconductors, may be used in place of phosphors in some embodiments of the invention. In particular, in appropriate materials, at wavelengths emitted by the primary light emitting region, k is greater than 0.01, more preferably greater than 0.1, and more preferably greater than 1. In such embodiments, in particular III-V and II-VI semiconductors embodiments, high fluence (as much as 100 $W/cm^2$ or higher) from the primary light emitting region may be required for efficient down-conversion efficiency in the luminescent material. In addition, a means for extracting light from the luminescent material must be provided, such as texturing, roughening, or shaping.

Having described the invention in detail, those skilled in the art will appreciate that, given the present disclosure, modifications may be made to the invention without departing from the spirit of the inventive concept described herein. For example, though the above examples describe III-nitride semiconductor devices, devices of other materials systems may be used. Also, though the above examples include phosphors, it is to be understood that other luminescent materials may be used, such as semiconductor nanoparticles, quantum dots, or organic dyes. Therefore, it is not intended that the scope of the invention be limited to the specific embodiments illustrated and described.

What is being claimed is:

1. A device comprising:
   a light emitting structure comprising a light emitting layer that emits first light;
   a first luminescent material comprising a ceramic phosphor disposed in a path of light emitted by the light emitting layer; and
   a second luminescent material comprising a luminescent semiconductor disposed in a path of light emitted by the light emitting layer, wherein the luminescent semiconductor is configured to absorb the first light and emit light of a different wavelength;
   wherein the first luminescent material is disposed between the second luminescent material and the light emitting structure.

2. The device of claim 1 wherein the first luminescent material is bonded to the light emitting structure.

3. The device of claim 2 further comprising a bonding material disposed between the first luminescent material and the light emitting structure.

4. The device of claim 3 wherein the bonding material comprises one of nanoparticles, glass, high index glass, metal oxide, metal fluoride, aluminum oxide, lead oxide, and tungsten oxide.

5. The device of claim 1 wherein the second luminescent material comprises one of III-V material and II-VI material.

6. The device of claim 1 wherein the second luminescent material comprises one of nanoparticles and quantum dots.

7. The device of claim 1 wherein light emitted by the light emitting layer, light emitted by the ceramic phosphor, and light emitted by the luminescent semiconductor are different in color.

8. The device of claim 1 wherein the light emitting structure is mounted on a host substrate, the host substrate comprising one of copper, an alloy of copper, silicon, aluminum nitride, and diamond.

9. The device of claim 1 further comprising a reflector disposed on at least one of the light emitting structure, the first luminescent material, and the second luminescent material.

10. The device of claim 9 wherein the reflector comprises a distributed Bragg reflector.

11. The device of claim 1 wherein the light emitting structure includes a non-semiconductor substrate.

12. A device comprising:
 a light emitting structure comprising a light emitting layer and a roughened or textured surface;
 a first luminescent material comprising a ceramic phosphor disposed in a path of light emitted by the light emitting layer; and
 a second luminescent material disposed in a path of light emitted by the light emitting layer;
 wherein the ceramic phosphor is a rigid agglomerate of tightly packed individual phosphor particles that is free of binder material.

13. The device of claim 12 wherein the surface is roughened or textured by one of chemical mechanical polishing, dry etching, and photoelectrochemical etching.

14. The device of claim 12 wherein the light emitting layer comprises III-nitride material.

15. The device of claim 12 wherein at least one surface of the ceramic phosphor is roughened, textured, or shaped.

16. The device of claim 12 wherein the first luminescent material comprises one of $(Lu_{1-x-y-a-b}Y_xGd_y)_3(Al_{1-z}Ga_z)_5O_{12}:Ce_aPr_b$ wherein $0<x<1$, $0<y<1$, $0<z \leq 0.1$, $0<a \leq 0.2$ and $0 \leq b \leq 0.1$, $Lu_3Al_5O_{12}:Ce^{3+}$, $Y_3Al_5O_{12}:Ce^{3+}$, $(Sr_{1-x-y}Ba_xCa_y)_{2-z}Si_{5-a}Al_aN_{8-a}O_a:Eu_z^{2+}$ wherein $0 \leq a <5$, $0<x \leq 1$, $0 \leq y \leq 1$, and $0<z \leq 1$, $Sr_2Si_5N_8:Eu^{2+}$, $(Sr_{1-a-b}Ca_bBa_c)Si_xN_yO_z:Eu_a^{2+}$ (a =0.002-0.2, b =0.0-0.25, c =0.0-0.25, x =1.5-2.5, y =1.5-2.5, z =1.5-2.5), $SrSi_2N_2O_2:Eu^{2+}$; $(Sr_{1-u-v-x}Mg_uCa_vBa_x)(Ga_{2-y-z}Al_yIn_zS_4):Eu^{2+}$, $SrGa_2S_4:Eu^{2+}$; $Sr_{1-x}Ba_xSiO_4:Eu^{2+}$, $(Ca_{1-x}Sr_x)S:Eu^{2+}$, $CaS:Eu^{2+}$ and $SrS:Eu^{2+}$.

\* \* \* \* \*